United States Patent
Tanaka et al.

(10) Patent No.: US 11,665,964 B2
(45) Date of Patent: May 30, 2023

(54) METHOD FOR MANUFACTURING THERMOELECTRIC CONVERSION ELEMENT AND THERMOELECTRIC CONVERSION ELEMENT

(71) Applicant: KELK Ltd., Kanagawa (JP)

(72) Inventors: Tetsushi Tanaka, Kanagawa (JP); Katsushi Fukuda, Kanagawa (JP); Mikio Koyano, Ishikawa (JP); Tatsuya Shimoda, Nagano (JP)

(73) Assignee: KELK Ltd., Kanagawa (JP)

( * ) Notice: Subject to any disclaimer, the term of this patent is extended or adjusted under 35 U.S.C. 154(b) by 79 days.

(21) Appl. No.: 17/273,516

(22) PCT Filed: Jul. 11, 2019

(86) PCT No.: PCT/JP2019/027530
§ 371 (c)(1),
(2) Date: Mar. 4, 2021

(87) PCT Pub. No.: WO2020/054205
PCT Pub. Date: Mar. 19, 2020

(65) Prior Publication Data
US 2021/0202820 A1   Jul. 1, 2021

(30) Foreign Application Priority Data
Sep. 10, 2018   (JP) .............................. JP2018-168741

(51) Int. Cl.
*H01L 35/32*   (2006.01)
*H01L 35/34*   (2006.01)

(52) U.S. Cl.
CPC .............. *H01L 35/32* (2013.01); *H01L 35/34* (2013.01)

(58) Field of Classification Search
CPC ................................ H01L 35/34; H01L 35/32
See application file for complete search history.

(56) References Cited

U.S. PATENT DOCUMENTS 6,410,840 B1 *  6/2002  Sudo ...................... H01L 35/16
136/201
2013/0306124 A1  11/2013  Yajima et al.
(Continued)

FOREIGN PATENT DOCUMENTS

JP      200168746    3/2001
JP      200943808    2/2009
(Continued)

OTHER PUBLICATIONS

Fabian-Mijangos, Enhanced performance thermoelectric module having asymmetrical legs, Energy Conversion and Management 148 (201 7) 1372-1381 (Year: 2017).*
(Continued)

*Primary Examiner* — Devina Pillay
(74) *Attorney, Agent, or Firm* — Fish & Richardson P.C.

(57) ABSTRACT

A method for manufacturing a thermoelectric conversion element includes forming a thermoelectric film containing a thermoelectric material on a surface of a substrate, pressing the thermoelectric film with a mold to form a pattern of the thermoelectric film on the surface of the substrate, and heating the pattern of the thermoelectric film formed on the surface of the substrate to generate the thermoelectric conversion element.

5 Claims, 11 Drawing Sheets

[RELATIONSHIP BETWEEN SHAPE FACTOR AND MAXIMUM ELECTRIC CURRENT VALUE]

(56) References Cited

U.S. PATENT DOCUMENTS

| | | | | |
|---|---|---|---|---|
| 2015/0136192 A1* | 5/2015 | Jacques | ............ | H01L 35/32 |
| | | | | 136/205 |
| 2017/0213950 A1* | 7/2017 | Kwak | ............ | H01L 35/04 |

FOREIGN PATENT DOCUMENTS

| | | |
|---|---|---|
| JP | 2010040988 | 2/2010 |
| JP | 2012175781 | 9/2012 |
| JP | 2017135361 | 8/2017 |

OTHER PUBLICATIONS

Qungui, Influence of Structure Parameters on Performance of the Thermoelectric Module, Journal of Wuhan University of Technology-Mater. Sci. Ed. vol. 26, pp. 464-468 (2011) (Year: 2011).*

PCT International Search Report in International Application No. PCT/JP2019/027530, dated Sep. 24, 2019, 6 pages (with English translation).

* cited by examiner

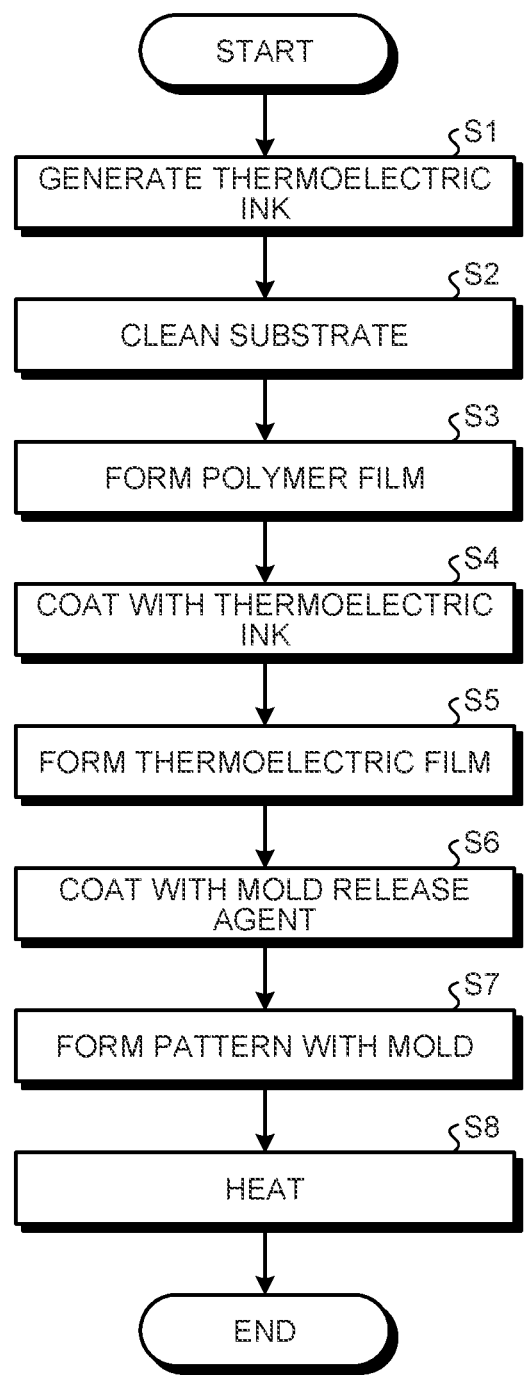

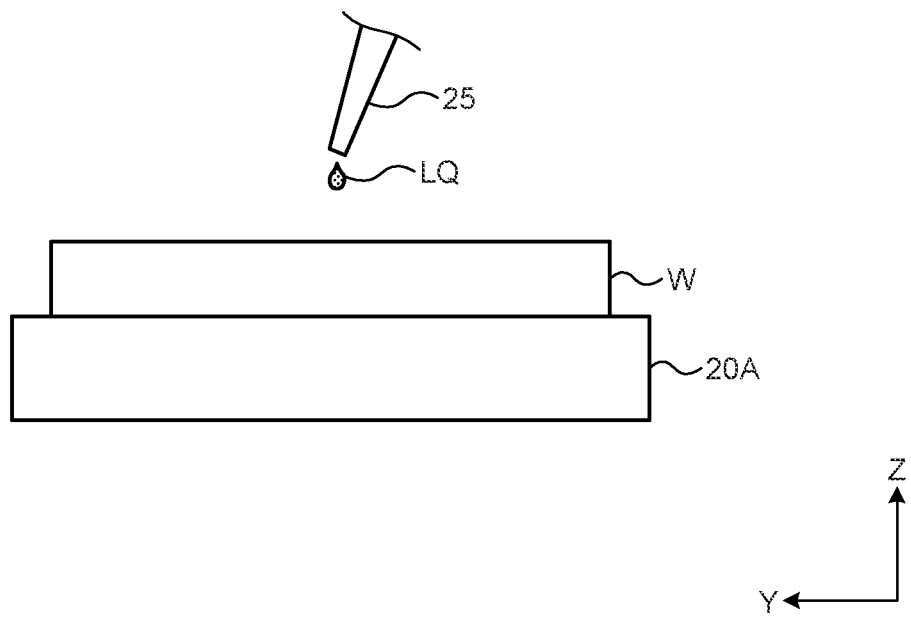
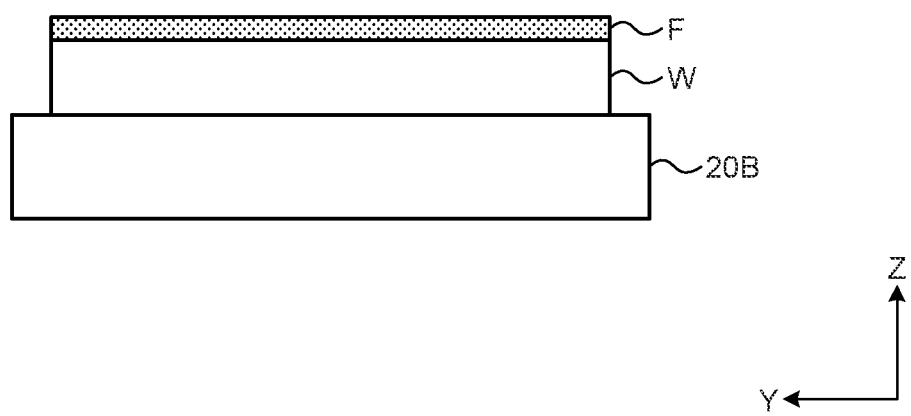

METHOD FOR MANUFACTURING THERMOELECTRIC CONVERSION ELEMENT AND THERMOELECTRIC CONVERSION ELEMENT

CROSS-REFERENCE TO RELATED APPLICATIONS

This application is a National Stage application of International Application No. PCT/JP2019/027530, filed on Jul. 11, 2019, which claims priority to Japanese Patent Application No. 2018-168741, filed on Sep. 10, 2019. The contents of the prior applications are incorporated herein in their entirety.

FIELD

The present invention relates to a method for manufacturing a thermoelectric conversion element and a thermoelectric conversion element.

BACKGROUND

A thermoelectric conversion element that generates electric power by utilizing the Seebeck effect is known. The thermoelectric conversion element generates electric power by one end surface of the thermoelectric conversion element being cooled and the other end surface of the thermoelectric conversion element being heated. An example of a method for manufacturing the thermoelectric conversion element is disclosed in Patent Literature 1.

CITATION LIST

Patent Literature

Patent Literature 1: JP 2010-040998 A

SUMMARY

Technical Problem

As one of the factors that determine the thermoelectric characteristics of the thermoelectric conversion element, there is a shape factor that indicates a ratio between the height and the cross-sectional area of the thermoelectric conversion element. In the thermoelectric conversion element, when an appropriate shape factor can be obtained, an appropriate thermoelectric characteristic can be obtained.

According to an aspect of the present invention, it is an object to provide a thermoelectric conversion element having an appropriate shape factor.

Solution to Problem

According to an aspect of the present invention, a method for manufacturing a thermoelectric conversion element, the method comprises: forming a thermoelectric film containing a thermoelectric material on a surface of a substrate; pressing the thermoelectric film with a mold to form a pattern of the thermoelectric film on the surface of the substrate; and heating the pattern of the thermoelectric film formed on the surface of the substrate to generate the thermoelectric conversion element.

Advantageous Effects of Invention

According to an aspect of the present invention, a thermoelectric conversion element having an appropriate shape factor is provided.

BRIEF DESCRIPTION OF DRAWINGS

FIG. 5 is a flowchart illustrating a method for manufacturing the thermoelectric conversion element according to the first embodiment.

FIG. 6 is a schematic view illustrating the method for manufacturing the thermoelectric conversion element according to the first embodiment.

FIG. 7 is a schematic view illustrating the method for manufacturing the thermoelectric conversion element according to the first embodiment.

DESCRIPTION OF EMBODIMENTS

Hereinafter, embodiments according to the present invention will be described with reference to the drawings, but the present invention is not limited thereto. The components in the embodiments described below can be combined as appropriate. In addition, a part of the components is not used, in some cases.

In the following description, an XYZ orthogonal coordinate system is set, and positional relationships of respective units will be described with reference to such an XYZ orthogonal coordinate system. A direction parallel to X axis on a predetermined plane is referred to as X-axis direction, a direction parallel to Y axis orthogonal to X axis on the predetermined plane is referred to as Y-axis direction, and a direction parallel to Z axis orthogonal to the predetermined plane is referred to as Z-axis direction. X axis, Y axis, and Z axis are orthogonal to one another. A plane including X axis and Y axis is referred to as XY plane, a plane including Y axis and Z axis is referred to as YZ plane, and a plane including Z axis and X axis is referred to as XZ plane. XY plane is parallel to the predetermined plane. XY plane, YZ plane, and XZ plane are orthogonal to one another.

First Embodiment

<Thermoelectric Power Generation Module>

Figure 1:
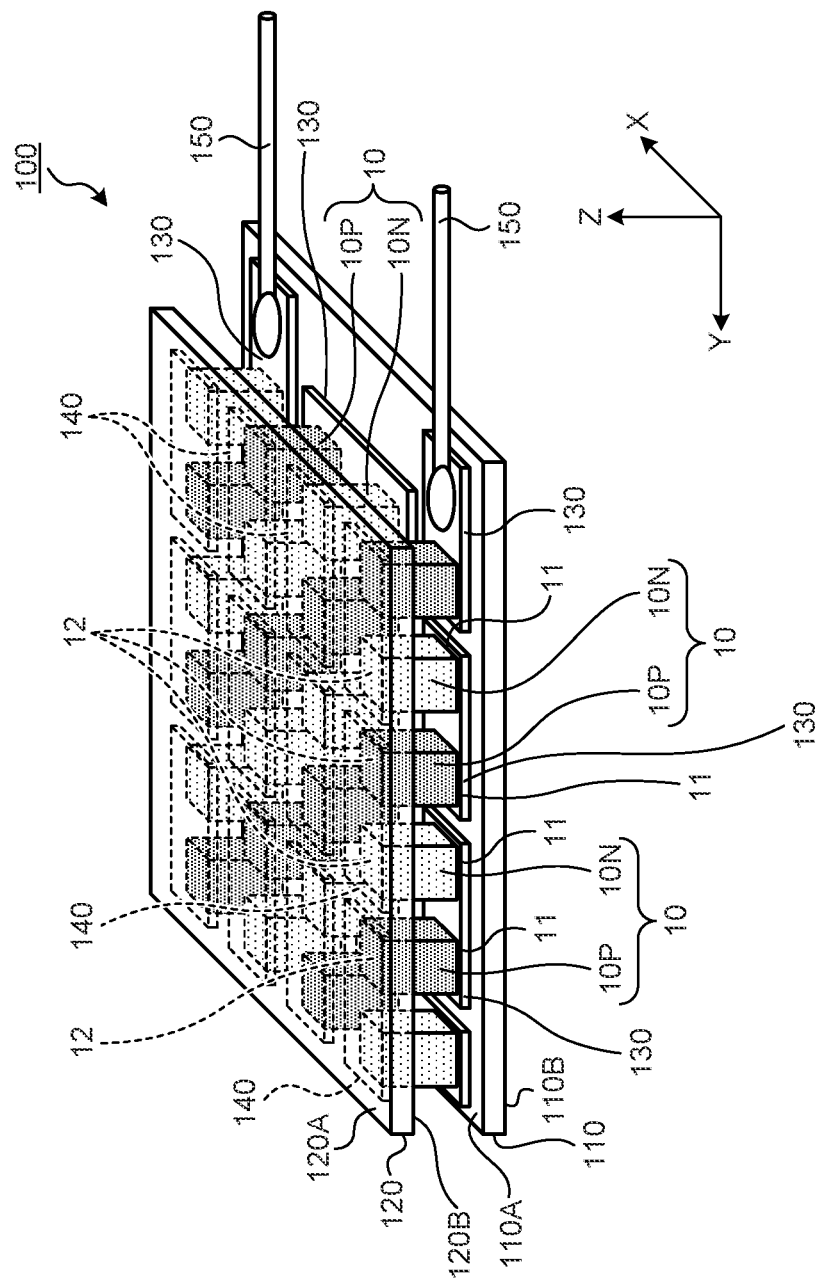
FIG. 1 is a perspective view schematically illustrating a thermoelectric power generation module according to a first embodiment.

FIG. 1 is a perspective view schematically illustrating a thermoelectric power generation module 100 according to the present embodiment. The thermoelectric power generation module 100 includes a plurality of thermoelectric conversion elements 10 arranged on XY plane, a first substrate 110 arranged on −Z side of the thermoelectric conversion elements 10, a second substrate 120 arranged on +Z side of the thermoelectric conversion elements 10, electrodes 130 arranged between the thermoelectric conversion elements 10 and the first substrate 110, electrodes 140 arranged between the thermoelectric conversion elements 10 and the second substrate 120, and lead wires 150.

The thermoelectric conversion element 10 includes a thermoelectric material such as a bismuth tellurium-based compound (Bi—Te). The thermoelectric conversion element 10 includes a first thermoelectric conversion element 10P, which is a P-type thermoelectric semiconductor element, and a second thermoelectric conversion element 10N, which is an N-type thermoelectric semiconductor element. A plurality of first thermoelectric conversion elements 10P and a plurality of second thermoelectric conversion elements 10N are arranged on XY plane. In X-axis direction, the first thermoelectric conversion element 10P and the second thermoelectric conversion element 10N are alternately arranged. In Y-axis direction, the first thermoelectric conversion element 10P and the second thermoelectric conversion element 10N are alternately arranged.

The plurality of thermoelectric conversion elements 10 each has a first end surface 11 and a second end surface 12. The first end surface 11 is an end surface on −Z side of the thermoelectric conversion element 10. The second end surface 12 is an end surface on +Z side of the thermoelectric conversion element 10. The first end surface 11 is substantially parallel to XY plane. The second end surface 12 is substantially parallel to XY plane.

The electrode 130 is connected with each of a pair of the first thermoelectric conversion elements 10P and the second thermoelectric conversion elements 10N, which are adjacent to each other. The electrode 130 connects the first end surface 11 of the first thermoelectric conversion element 10P and the first end surface 11 of the second thermoelectric conversion element 10N, which are adjacent to each other.

The electrode 140 is connected with each of a pair of the first thermoelectric conversion elements 10P and the second thermoelectric conversion elements 10N, which are adjacent to each other. The electrode 140 connects the second end surface 12 of the first thermoelectric conversion element 10P and the second end surface 12 of the second thermoelectric conversion element 10N, which are adjacent to each other.

The first substrate 110 supports a plurality of electrodes 130. The first substrate 110 is formed of an electrically insulating material such as ceramics or polyimide. The first substrate 110 includes an upper surface 110A and a lower surface 110B. The upper surface 110A and the lower surface 110B are each parallel to XY plane. The first substrate 110 is arranged on −Z side of the first thermoelectric conversion elements 10P, the second thermoelectric conversion elements 10N, and the electrodes 130. The plurality of electrodes 130 is each connected with the upper surface 110A of the first substrate 110.

The second substrate 120 supports a plurality of electrodes 140. The second substrate 120 is formed of an electrically insulating material such as ceramics or polyimide. The second substrate 120 includes an upper surface 120A and a lower surface 120B. The upper surface 120A and the lower surface 120B are each parallel to the XY plane. The second substrate 120 is arranged on +Z side of the first thermoelectric conversion elements 10P, the second thermoelectric conversion elements 10N, and the electrodes 140. The plurality of electrodes 140 is each connected with the lower surface 120B of the second substrate 120.

In Z-axis direction, the thermoelectric conversion elements 10 are arranged between the first substrate 110 and the second substrate 120. When the first substrate 110 is cooled and the second substrate 120 is heated, a temperature difference is given between the first end surfaces 11 and the second end surfaces 12 of the thermoelectric conversion elements 10. When such a temperature difference is given between the first end surface 11 and the second end surface 12 of the first thermoelectric conversion element 10P, which is a P-type thermoelectric semiconductor element, holes move from the second end surface 12 toward the first end surface 11 in the first thermoelectric conversion element 10P. When such a temperature difference is given between the first end surface 11 and the second end surface 12 of the second thermoelectric conversion element 10N, which is an N-type thermoelectric semiconductor element, electrons move from the second end surface 12 to the first end surface 11 in the second thermoelectric conversion element 10N. Due to the movements of the holes and the electrons, a potential difference is generated between the first end surface 11 and the second end surface 12. In the thermoelectric conversion element 10, the potential difference is generated between the first end surface 11 and the second end surface 12, due to the temperature difference between the first end surface 11 and the second end surface 12.

The first thermoelectric conversion element 10P and the second thermoelectric conversion element 10N are connected with each other via the electrodes 130 and 140. The potential difference is generated between the first end surface 11 and the second end surface 12, and the potential difference is generated between the electrode 130 and the electrode 140.

Accordingly, the thermoelectric power generation module 100 generates electric power. The lead wire 150 is connected with the electrode 130. The thermoelectric power generation module 100 outputs electric power via the lead wire 150.

<Thermoelectric Conversion Element>

Figure 2:
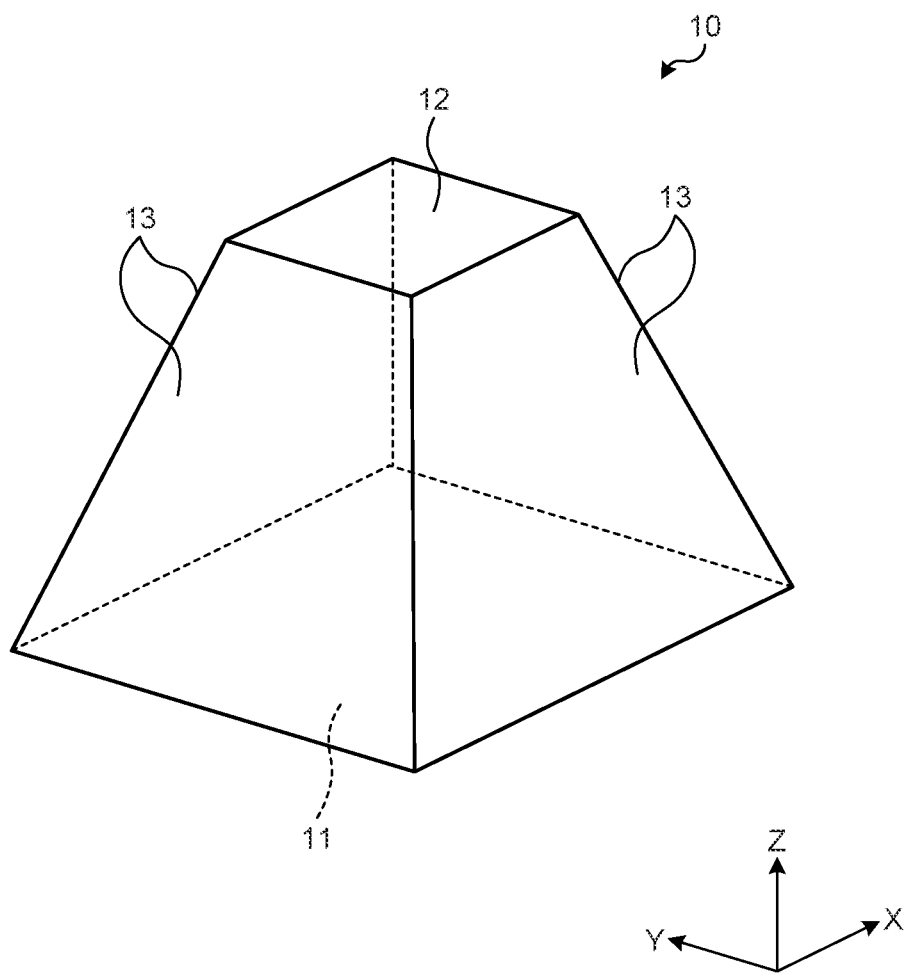
FIG. 2 is a perspective view schematically illustrating a thermoelectric conversion element according to the first embodiment.
Figure 3:
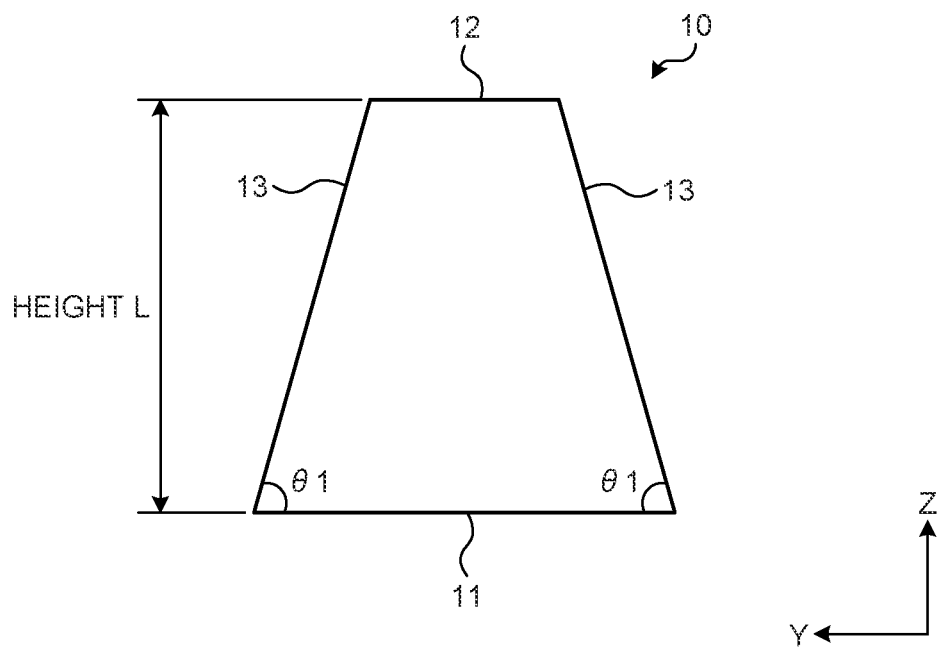
FIG. 3 is a cross-sectional view schematically illustrating the thermoelectric conversion element according to the first embodiment.
Figure 4:
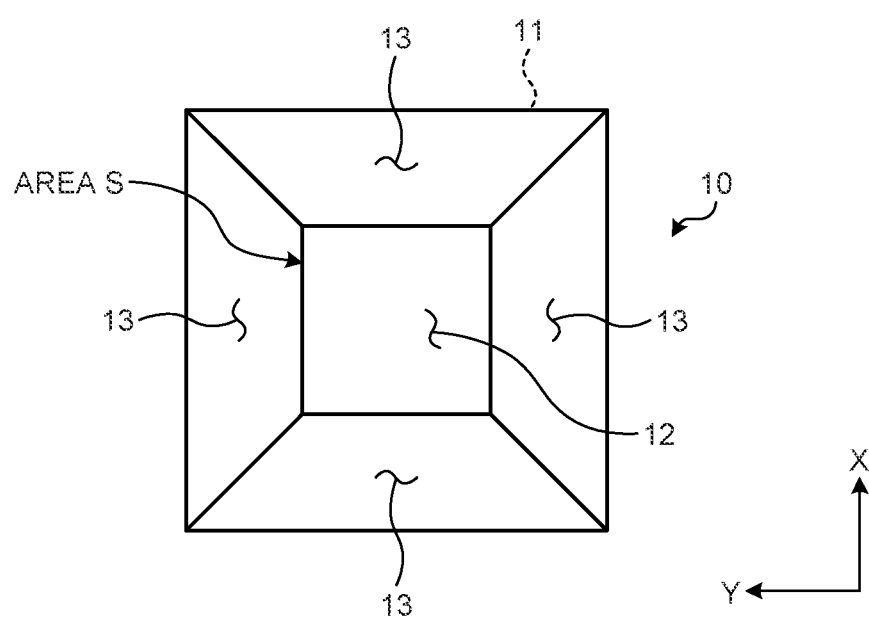
FIG. 4 is a plan view schematically illustrating the thermoelectric conversion element according to the first embodiment.

FIG. 2 is a perspective view schematically illustrating the thermoelectric conversion element 10 according to the present embodiment. FIG. 3 is a cross-sectional view schematically illustrating the thermoelectric conversion element 10 according to the present embodiment. FIG. 3 is a cross-sectional view of the thermoelectric conversion element 10 parallel to YZ plane. FIG. 4 is a plan view schematically illustrating the thermoelectric conversion element 10 according to the present embodiment. As illustrated in FIGS. 2, 3, and 4, the thermoelectric conversion element 10 includes the first end surface 11, the second end surface 12, and side surfaces 13 connecting a peripheral edge portion of the first end surface 11 and a peripheral edge portion of the second end surface 12.

The first end surface 11 is an end surface on −Z side of the thermoelectric conversion element 10. The second end surface 12 is an end surface on +Z side of the thermoelectric conversion element 10. The first end surface 11 is parallel to XY plane. The second end surface 12 is parallel to XY plane. Due to the temperature difference between the first end surface 11 and the second end surface 12, the potential difference is generated between the first end surface 11 and the second end surface 12. Electric current flows in Z-axis direction between the first end surface 11 and the second end surface 12 in the thermoelectric conversion element 10.

In a case where S denotes a cross-sectional area (a first cross section) of the thermoelectric conversion element 10 parallel to the first end surface 11 (XY plane), and L denotes a height indicating a distance between the first end surface 11 and the second end surface 12 in Z-axis direction orthogonal to the first end surface 11, the thermoelectric conversion element 10 according to the present embodiment satisfies conditions of following expressions (1) and (2).

$$100 \, [\mu m^2] \leq S \quad (1)$$

$$5 \, [\mu m] \leq L \leq 100 \, [\mu m] \quad (2)$$

In the present embodiment, an outer shape in a cross section (the first cross section) of the thermoelectric conversion element 10 parallel to XY plane is substantially a square. In FIGS. 2, 3, and 4, of the four sides of the outer shape in the cross section of the thermoelectric conversion element 10 parallel to XY plane, two sides are parallel to X axis, and two sides are parallel to Y axis.

On XY plane, an outer shape of the second end surface 12 is smaller than the outer shape of the first end surface 11. In a cross section (a second cross section) of the thermoelectric conversion element 10 parallel to YZ plane, the side surface 13 is inclined with respect to the first end surface 11. On YZ plane, the side surface 13 has a straight line shape. Further, on YZ plane, a corner portion is formed between the side surface 13 and the first end surface 11, and a corner portion is formed between the side surface 13 and the second end surface 12.

As illustrated in FIG. 3, in a case where θ1 denotes an internal angle formed by the first end surface 11 and the side surface 13, the thermoelectric conversion element 10 according to the present embodiment satisfies a condition of a following expression (3).

$$25[°] \leq \theta 1 < 90[°] \quad (3)$$

The thermoelectric conversion element 10 has a tapered shape in which a cross-sectional area S gradually decreases from the first end surface 11 to the second end surface 12.

It is to be noted that the outer shape and the size in a cross section of the thermoelectric conversion element 10 parallel to XZ plane are substantially equal to the outer shape and the size in a cross section of the thermoelectric conversion element 10 parallel to YZ plane.

In the present embodiment, the cross-sectional area S of the thermoelectric conversion element 10 denotes a cross-sectional area of the thermoelectric conversion element 10 at the center in Z-axis direction. That is, the area S denotes a cross-sectional area at a position apart by [L/2] in +Z direction from the first end surface 11.

<Method for Manufacturing Thermoelectric Conversion Element>

FIG. 5 is a flowchart illustrating a method for manufacturing the thermoelectric conversion element 10 according to the present embodiment. FIG. 6, FIG. 7, FIG. 8, and FIG. 9 are each a schematic view illustrating the method for manufacturing the thermoelectric conversion element 10 according to the present embodiment.

(Step S1: Generating Thermoelectric Ink)

A thermoelectric ink LQ for manufacturing the thermoelectric conversion element 10 is generated. The thermoelectric ink LQ is produced by dispersing fine particles of a thermoelectric material in a solvent.

Examples of the thermoelectric material may include bismuth (Bi), bismuth tellurium-based compounds (Bi—Te), bismuth antimony-based compounds (Bi—Sb), lead tellurium-based compounds (Pb—Te), cobalt antimony-based compounds (Co—Sb), iridium antimony-based compounds (Ir—Sb), cobalt arsenic-based compounds (Co—As), silicon germanium-based compounds (Si—Ge), copper selenium-based compounds (Cu—Se), gadorium selenium-based compounds (Gd—Se), boron carbide-based compounds, tellurium-based perovskite oxides, rare earth sulfides, TAGS-based compounds (GeTe—AgSbTe$_2$), Heusler-type TiNiSn, FeNbSb, and TiCoSb-based substances, and the like.

Examples of the solvent may include organic solvents such as methanol, ethanol, isopropyl alcohol, propanol, acetone, toluene, and hexane. The solvent may be a mixed solvent containing a plurality of organic solvents, or one solvent may be used alone. Moreover, the solvent may contain water.

In the present embodiment, the thermoelectric ink LQ is produced by dispersing fine particles of a bismuth tellurium-based compound in an organic solvent.

(Step S2: Cleaning Substrate)

A substrate W is prepared, and the surface of the substrate W is cleaned. For example, the surface of the substrate W is cleaned by a plasma asking treatment.

Examples of the substrate W include a silicon wafer. It is to be noted that the substrate W may be a ceramic substrate such as alumina (Al$_2$O$_3$) or aluminum nitride (AlN), or an insulating substrate formed of an electrically insulating material such as polyimide. Further, the substrate W may be formed of an insulating material such as silicon carbide (SiC) or beryllia (BeO) having good thermal conductivity.

(Step S3: Forming Polymer Film)

A polymer film is formed on the surface of the substrate W. Examples of the polymer film include a film containing polymethyl methacrylate (PMMA: polymethyl methacrylate). Polymer ink containing a polymer and a solvent is coated on the surface of the substrate W, based on, for example, a spin coating method. After the polymer ink is coated on the surface of the substrate W, the polymer ink is dried to form a polymer film on the surface of the substrate W. It is to be noted that after the polymer film is formed, the thickness of the polymer film may be adjusted by a plasma etching treatment, or the surface of the polymer film may be planarized by pressurizing the polymer film with a roller. The formation of the polymer film on the surface of the substrate W suppresses generation of a crack in a thermoelectric film F to be formed later. It is to be noted that the polymer film may not necessarily be formed on the surface of the substrate W.

(Step S4: Coating Thermoelectric Ink)

Next, as illustrated in FIG. 6, the thermoelectric ink LQ generated in step S1 is coated on the surface of the substrate W. It is to be noted that in a case where a material film such as a polymer film is formed on the surface of the substrate W, the surface of the substrate W is a concept of including the surface of the material film. The thermoelectric ink LQ is coated on the surface of the substrate W, based on, for example, a coating method such as a spin coating method or a roll coating method.

In the example illustrated in FIG. 6, the substrate W is held by a substrate holder 20A. The substrate holder 20A holds the substrate W so that the surface of the substrate W and XY plane are parallel to each other. The thermoelectric ink LQ is supplied from a dispenser 25 to the surface of the substrate W held by the substrate holder 20A. The substrate holder 20A rotates while the thermoelectric ink LQ is being supplied from the dispenser 25. Consequently, the thermoelectric ink LQ is coded on the surface of the substrate W, based on the spin coating method.

(Step S5: Forming Thermoelectric Film)

After the thermoelectric ink LQ is coated on the surface of the substrate W, the thermoelectric ink LQ is dried in order to remove at least a part of the solvent contained in the thermoelectric ink LQ. When the thermoelectric ink LQ is dried, a thermoelectric film F containing a thermoelectric material is formed on the surface of the substrate W, as illustrated in FIG. 7. As a method for drying the thermoelectric ink LQ, at least one of heat drying, natural drying, and decompression drying is mentioned as an example. In the present embodiment, the substrate W is held by a substrate holder 20B, and is installed in an atmosphere equal to or higher than 20[° C.] and equal to or lower than 50[° C.]. Consequently, the thermoelectric ink LQ is dried, and the thermoelectric film F is formed on the surface of the substrate W. After the thermoelectric film F is formed, a roller may pressurize the thermoelectric film F to planarize the surface of the thermoelectric film F.

(Step S6: Coating Mold Release Agent)

After the thermoelectric film F is formed, the surface of the thermoelectric film F is coated with a mold release agent.

(Step S7: Forming Pattern with Mold)

Figure 8:
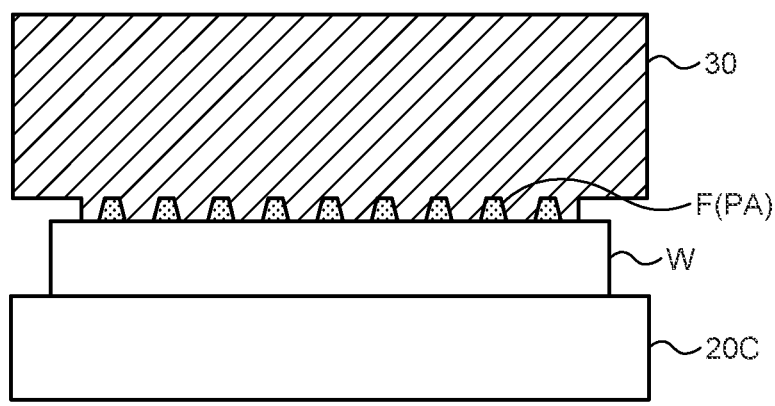
FIG. 8 is a schematic view illustrating the method for manufacturing the thermoelectric conversion element according to the first embodiment.

Next, as illustrated in FIG. 8, in a state where the substrate W is held by a substrate holder 20C, by pressing the thermoelectric film F with a mold 30, a pattern PA of the thermoelectric film F is formed on the surface of the substrate W. The mold 30 is made of a metal such as stainless steel, for example. The mold 30 has an uneven-shaped form that matches a target shape of the thermoelectric conversion element 10. The substrate holder 20C holds the substrate W so that the surface of the substrate W (the surface of the thermoelectric film F) and XY plane are parallel to each other. The mold 30 is arranged at a position facing the surface of the thermoelectric film F, and then moves in −Z direction to press the thermoelectric film F.

In the present embodiment, the pattern PA is formed in an air atmosphere of, for example, 85[° C.]. It is to be noted that the substrate holder 20C that holds the substrate W may be heated to 85[° C.], or the mold 30 may be heated to 85[° C.]. The pattern PA of the thermoelectric film F is formed by pressing the thermoelectric film F with the mold 30 with a force of 20 [MPa] for five minutes. It is to be noted that the pattern PA may be formed in an inert gas atmosphere of 85[° C.], for example.

In step S7, the pattern PA is formed so as to satisfy the conditions of the above expressions (1) and (2). The area S of the thermoelectric conversion element 10 indicates the cross-sectional area (the first cross section) parallel to the surface of the substrate W. The height L of the thermoelectric conversion element 10 indicates the dimension of the thermoelectric conversion element 10 in Z-axis direction orthogonal to the surface of the substrate W.

Further, in step S7, the pattern PA is formed so as to satisfy the condition of the above expression (3). That is, the pattern PA is formed in a tapered shape in which the cross-sectional area S gradually decreases from the first end surface 11 to the second end surface 12. The mold 30 has an uneven-shaped form that matches a target shape of the pattern PA. Since the uneven-shaped form and the pattern PA of the mold 30 are tapered, after the pattern PA is formed on the thermoelectric film F with the mold 30, the mold 30 and the thermoelectric film F can be smoothly separated from each other.

(Step S8: Heating)

Figure 9:
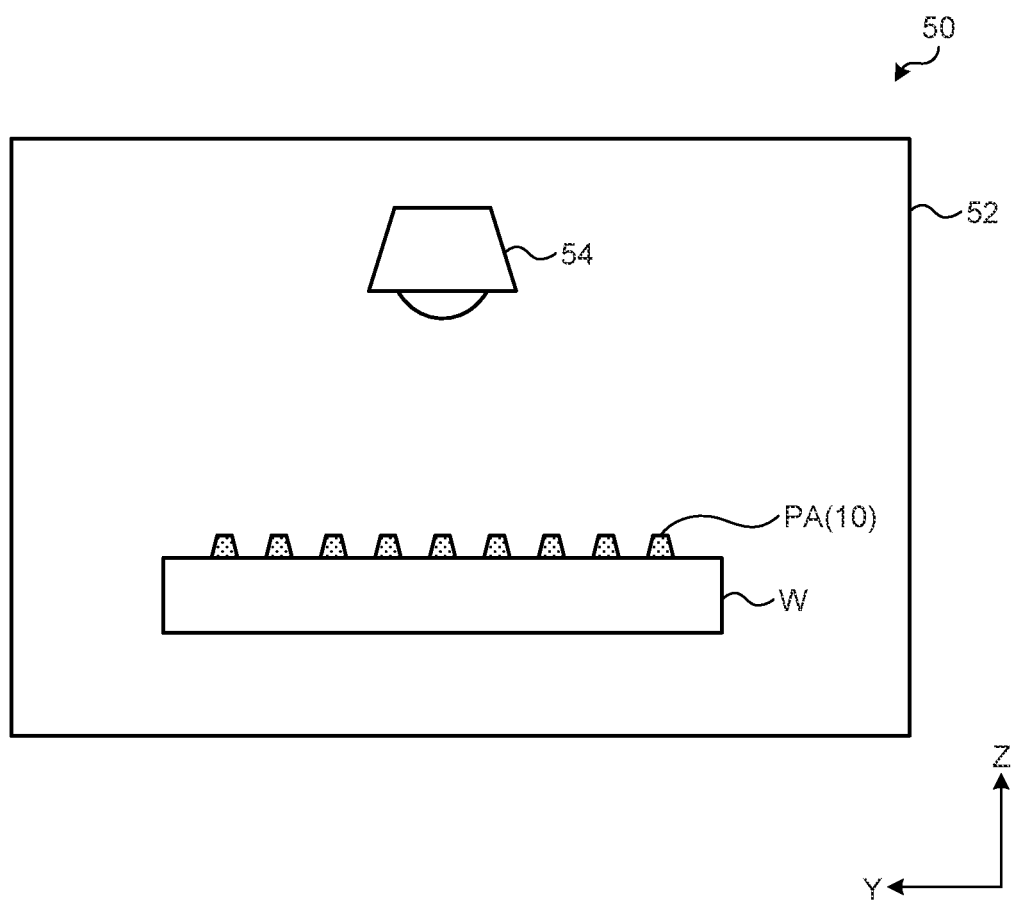
FIG. 9 is a schematic view illustrating the method for manufacturing the thermoelectric conversion element according to the first embodiment.

After the pattern PA of the thermoelectric film F is formed, the substrate W is taken out of the substrate holder 20C. As illustrated in FIG. 9, the substrate W taken out of the substrate holder 20C is conveyed to an annealing device 50. In the annealing device 50, the pattern PA of the thermoelectric film F formed on the surface of the substrate W is heated. Heating of the pattern PA includes rapid thermal annealing (RTA: Rapid Thermal Annealing) with radiant heat.

In the present embodiment, the substrate W is accommodated in a chamber 52 of the annealing device 50, and is heated with the radiant heat of a lamp 54 for five minutes in an inert gas atmosphere of argon gas equal to or higher than 400[° C.] and equal to or lower than 550[° C.].

The pattern PA of the thermoelectric film F is baked by heating.

Accordingly, the thermoelectric conversion element 10 is generated on the surface of the substrate W.

The heating including the rapid thermal annealing is performed, and the pattern PA is baked.

Consequently, thermoelectric characteristics and mechanical characteristics (rigidity) of the thermoelectric conversion element 10 to be manufactured are improved. In addition, the rapid thermal annealing is performed.

Accordingly, the growth (upsizing) of crystal grains in the thermoelectric conversion element 10 is suppressed, and the thermoelectric conversion element 10 having a fine crystal grain size equal to or larger than 50 [nm] and equal to and smaller than one [μm] is generated. Further, the pattern PA of the thermoelectric film F is heated in an inert gas atmosphere.

Consequently, oxidation of the thermoelectric conversion element 10 to be manufactured is suppressed.

<Shape Factor>

As described above, in a case where S denotes a cross sectional area of the thermoelectric conversion element 10 parallel to XY plane and L denotes a height of the thermoelectric conversion element 10 in Z-axis direction, the thermoelectric conversion element 10 is manufactured so as to satisfy the conditions of the expressions (1) and (2). The ratio between the height L and the area S (L/S) is referred to as a shape factor.

The shape factor determines a maximum electric current value Imax of the thermoelectric conversion element 10. The maximum electric current value Imax denotes a maximum value of electric current that can flow between the first end surface 11 and the second end surface 12, in a case where a temperature difference is given between the first end surface 11 and the second end surface 12. As the temperature difference between the first end surface 11 and the second end surface 12 is larger, the value of the electric current flowing inside the thermoelectric conversion element 10 becomes larger.

However, when the temperature difference between the first end surface 11 and the second end surface 12 becomes a predetermined value or more, the electric current value is saturated and maintained at a constant value (a maximum value). The maximum electric current value Imax denotes the maximum value of the electric current that is saturated when the temperature difference between the first end surface 11 and the second end surface 12 becomes a predetermined value or more.

Figure 10:
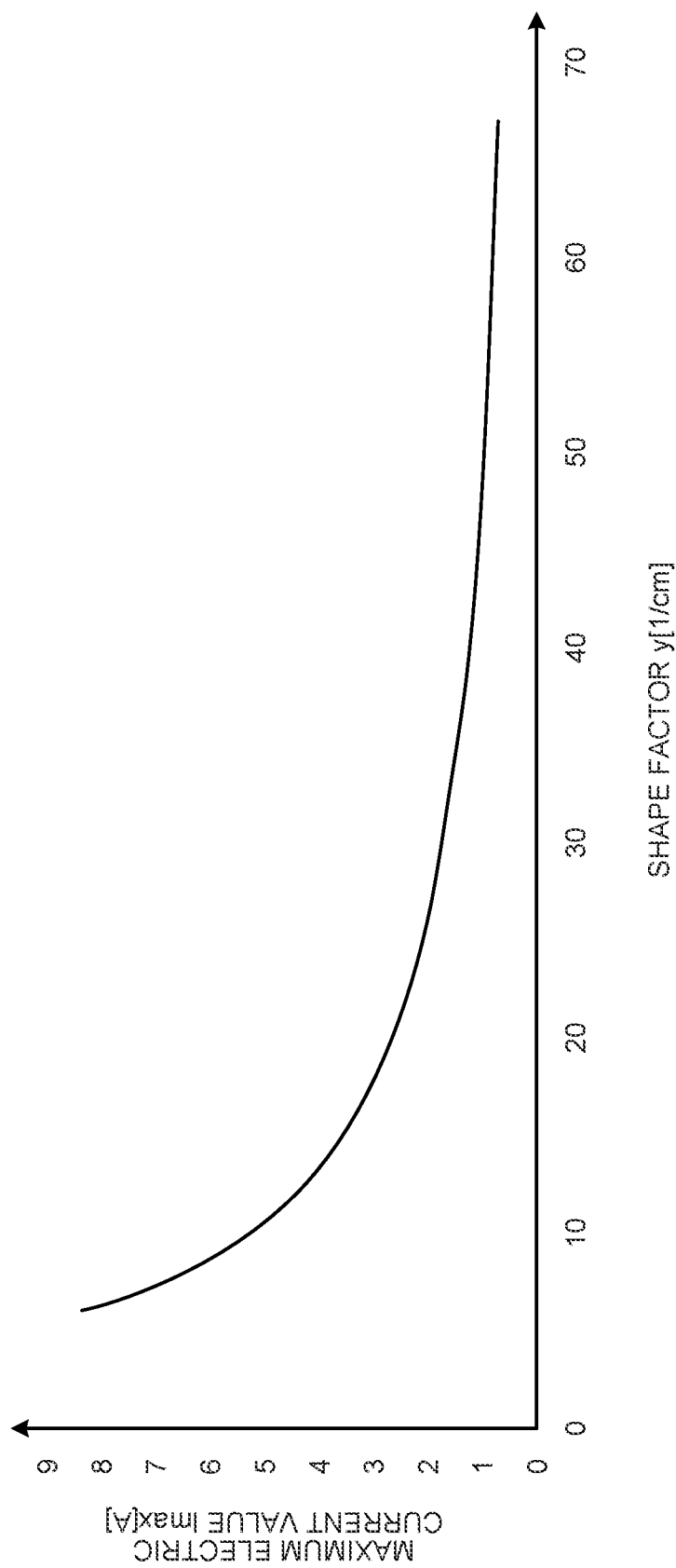
FIG. 10 is a diagram illustrating a relationship between a shape factor of the thermoelectric conversion element and a maximum electric current value.

FIG. 10 is a diagram illustrating a relationship between a shape factor y of the thermoelectric conversion element 10 and the maximum electric current value Imax. The shape factor y is a ratio (L/S) between the height L and the area S (y=L/S). In a case where the thermoelectric materials of the thermoelectric conversion elements 10 are the same, as the shape factor y is smaller, the maximum electric current value Imax becomes larger, and as the shape factor y is larger, the maximum electric current value Imax becomes smaller, as illustrated in FIG. 10. For example, as the area S is larger, the maximum electric current value Imax becomes larger, and as the area S is smaller, the maximum electric current value Imax becomes smaller. As the height L is smaller, the maximum electric current value Imax becomes larger, and as the height L is larger, the maximum electric current value Imax becomes smaller.

Figure 11:
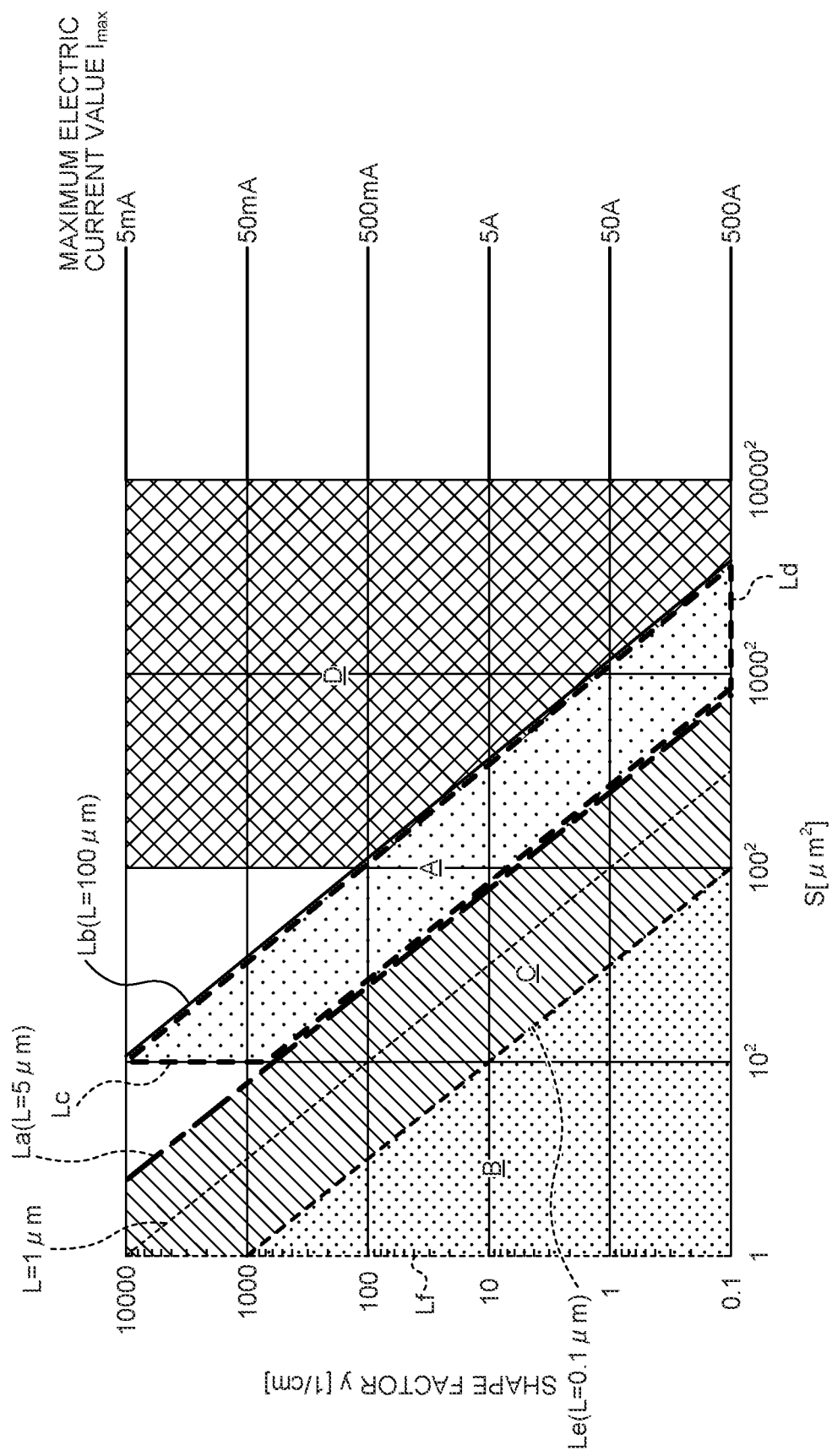
FIG. 11 is a diagram illustrating a relationship between the shape factor and a cross-sectional area of the thermoelectric conversion element.

FIG. 11 is a diagram illustrating a relationship between the shape factor y and the cross-sectional area S of the thermoelectric conversion element 10. FIG. 11 illustrates a relationship between the shape factor y and the area S of the thermoelectric conversion element 10, in a case where the thermoelectric conversion element 10 is formed of a thermoelectric material of a bismuth tellurium-based compound (Bi—Te).

As illustrated in FIG. 11, in a case where a diagram is drawn with the area S [μm²] as the horizontal axis and the shape factor y [1/cm] as the vertical axis, the thermoelectric conversion element 10 satisfies a condition in which the area S and the shape factor y exist in a range A surrounded by lines represented by following expressions (4), (5), (6), and (7).

$$y = 50000/S \quad (4)$$

$$y = 1000000/S \quad (5)$$

$$S = 100 \ [\mu m^2] \quad (6)$$

$$y = 0.1 \ [1/cm] \quad (7)$$

In FIG. 11, a line La is represented by the expression (4). A line Lb is represented by the expression (5). A line Lc is represented by the expression (6). A line Ld is expressed by the expression (7). The range A is a range surrounded by the line La, the line Lb, the line Lc, and the line Ld.

In the present embodiment, by pressing the thermoelectric film F formed on the substrate W with the mold 30, the pattern PA of the thermoelectric film F is formed on the surface of the substrate W.

Therefore, the thermoelectric conversion element 10 can be formed so that the area S and the shape factor y exist in the range A.

For example, in a case where the temperature of a laser diode in optical communication is adjusted by using the thermoelectric conversion element 10, the thermoelectric conversion element 10 with which the maximum electric current value Imax equal to or more than five [mA] and equal to or less than 50 [A] is demanded.

In a case where the temperature of a common heat exchanger that necessitates a large amount of heat absorption is adjusted, it is said that the thermoelectric conversion element 10 with which the maximum electric current value Imax equal to or more than 50 [A] can be obtained is demanded.

In the present embodiment, the thermoelectric conversion element 10 having the shape factor y of less than 0.1 can also be manufactured.

However, in a case where the maximum electric current value Imax exceeds 500 A, it is realistic to set y=0.1 as a lower limit value in consideration that the Joule heat between the thermoelectric elements and at a wiring portion becomes high.

In a case where the thermoelectric semiconductor element is manufactured, based on, for example, an existing thin film manufacturing method such as a vapor deposition method or a sputtering method, without the use of the mold 30, it is difficult to sufficiently increase the height L. It is said that approximately 0.1 [μm] is the maximum value of the height L of the thermoelectric conversion element that can be manufactured, based on the existing thin film manufacturing method. In trying to manufacture the thermoelectric conversion element which has the height L of 0.1 [μm] and with which the maximum electric current value Imax equal to or more than 500 [mA] and equal to or less than 50 [A] can be obtained, the area S of the thermoelectric conversion element has to be equal to or smaller than 100 [μm²]. That is, in the existing thin film manufacturing method, in FIG. 11, only thermoelectric conversion elements that satisfy a condition, in which the area S and the shape factor y exist in a range B surrounded by a line Le represented by a following expression (8), a line Lf represented by a following expression (9), and a line Ld represented by the above-described expression (7), can be manufactured.

$$y = 1000/S \quad (8)$$

$$S = 1 \ [\mu m^2] \quad (9)$$

The thermoelectric conversion element having the area S equal to or smaller than 100 [μm²] is very small in size with respect to a laser diode, which is a target of temperature control. The thermoelectric conversion elements that are too small have to be mounted sparsely when constituting a thermoelectric conversion module.

This may impair the reliability of the thermoelectric conversion module. In addition, in trying to manufacture a thermoelectric conversion element having a large height L, based on an existing thin film manufacturing method, it will take a considerable amount of time for film formation, and this is not realistic.

Further, in manufacturing a thermoelectric semiconductor element, based on, for example, an inkjet method without the use of the mold 30, the height L can be made larger than that of the existing thin film manufacturing method.

However, it is difficult to obtain a desired height L. It is said that approximately five [μm] is the maximum value of the height L of the thermoelectric conversion element that can be manufactured, based on the inkjet method. In trying to manufacture a thermoelectric conversion element having a height L of five [μm] and being capable of obtaining the maximum electric current value Imax equal to or more than 500 [mA] and equal to or less than 50 [A], the area S of the thermoelectric conversion element has to be equal to or smaller than 5000 [μm²]. That is, in the inkjet method, only thermoelectric conversion elements that satisfy a condition, in which the area S and the shape factor y exist in a range C surrounded by the line Le represented by the above-described expression (8), the line La represented by the above-described expression (4), the line Ld represented by the above-described expression (9), and the line Lf represented by the above-described expression (7), can be manufactured.

The thermoelectric conversion element having the area S equal to or smaller than 5000 [μm²] is also very small in size with respect to a laser diode, which is a target of temperature control. Further, in trying to manufacture a thermoelectric conversion element having a large height L, based on the inkjet method, it is necessary to repeat ink ejection and drying a plurality of times.

It will take a considerable amount of time for film formation, and this is a not realistic.

Further, typically, as a method for manufacturing a thermoelectric conversion element, a method for manufacturing a bulk (bulk: bulk) of a thermoelectric material, and cutting and processing the bulk to manufacture the thermoelectric conversion elements has been known. It is said that it is difficult to downsize the thermoelectric conversion element in the method for manufacturing the thermoelectric conversion element by cutting and processing the bulk, and approximately 100 [μm] is a minimum value of the height L of the thermoelectric conversion element that can be manufactured. In trying to manufacture the thermoelectric conversion element having a height of 100 [μm] and being capable of obtaining the maximum electric current value Imax equal to or more than 500 [mA] and equal to or less than 50 [A], only thermoelectric conversion elements that satisfy a condition, in which the area S and the shape factor y exist in a range D in FIG. 11, can be manufactured.

Further, in the case of the method for manufacturing the thermoelectric conversion element by cutting and processing the bulk, a large amount of kerf loss is generated. Therefore, it is disadvantageous from a viewpoint of material use efficiency.

In the present embodiment, the thermoelectric conversion element 10 is manufactured by pressing the thermoelectric film F with the mold 30 to form the pattern PA of the thermoelectric film F on the surface of the substrate W. According to the manufacturing method according to the present embodiment, the thermoelectric conversion element 10 having a height L equal to or higher than five [μm] and equal to or lower than 100 [μm] and the area S equal to or larger than 100 [μm²] can be manufactured in an efficient manner. That is, in the present embodiment, the thermoelectric conversion element 10 having the shape factor y suited to an application can be manufactured in an efficient manner.

<Advantage>

As described above, according to the present embodiment, the thermoelectric conversion element 10 is generated by pressing the thermoelectric film F formed on the surface of the substrate W with the mold 30 to form the pattern PA.

Therefore, the thermoelectric conversion element 10 having an appropriate shape factor y represented by the expressions (1) and (2) can be manufactured in an efficient manner.

Further, as compared to the method for manufacturing a thermoelectric conversion element by cutting and processing a bulk of a thermoelectric material, for example, the generation of kerf loss can be suppressed, and the thermoelectric conversion element 10 having high shape accuracy can be manufactured.

Further, in the present embodiment, the thermoelectric film F formed on the surface of the substrate W is heated and baked by the Rapid Thermal Annealing (RTA) with radiant heat. Such rapid thermal annealing suppresses the growth of crystal grains after being baked, and the thermoelectric conversion element 10 having a fine crystal grain size is generated. Generally, regarding the thermoelectric conversion element 10, it is desirable that the thermal conductivity be small, and the crystal grain size be small. The grain size can be reduced by the Rapid Thermal Annealing (RTA).

A performance index Z of the thermoelectric material is expressed by a following expression (10). In the expression (10), α represents a Seebeck count, ρ represents resistivity, and κ represents thermal conductivity.

$$Z = \alpha^2/\rho\kappa \qquad (10)$$

By making the crystal grain size smaller, the thermal conductivity κ can be reduced. According to the present embodiment, the thermoelectric conversion element 10 having a fine crystal grain size equal to or greater than 50 [nm] and equal to or smaller than one [μm] can be manufactured by performing the Rapid Thermal Annealing (RTA).

Further, in the present embodiment, the thermoelectric conversion element 10 satisfies the condition of the expression (3). That is, the thermoelectric conversion element 10 has a tapered shape in which the cross-sectional area S decreases from the surface of the substrate W in +Z direction. Consequently, after the pattern PA is formed on the thermoelectric film F with the mold 30, the mold 30 and the thermoelectric film F can be smoothly separated from each other.

Second Embodiment

A second embodiment will be described. In the following description, the same or equivalent components as those in the above-described embodiment are designated by the same reference numerals, and the description thereof will be simplified or omitted.

In the first embodiment described above, the first end surface 11 and the second end surface 12 each have a substantially square shape, and four side surfaces 13, which respectively connect four sides of the first end surface 11 and four sides of the second end surface 12, are inclined with respect to the first end surface 11.

Figure 12:
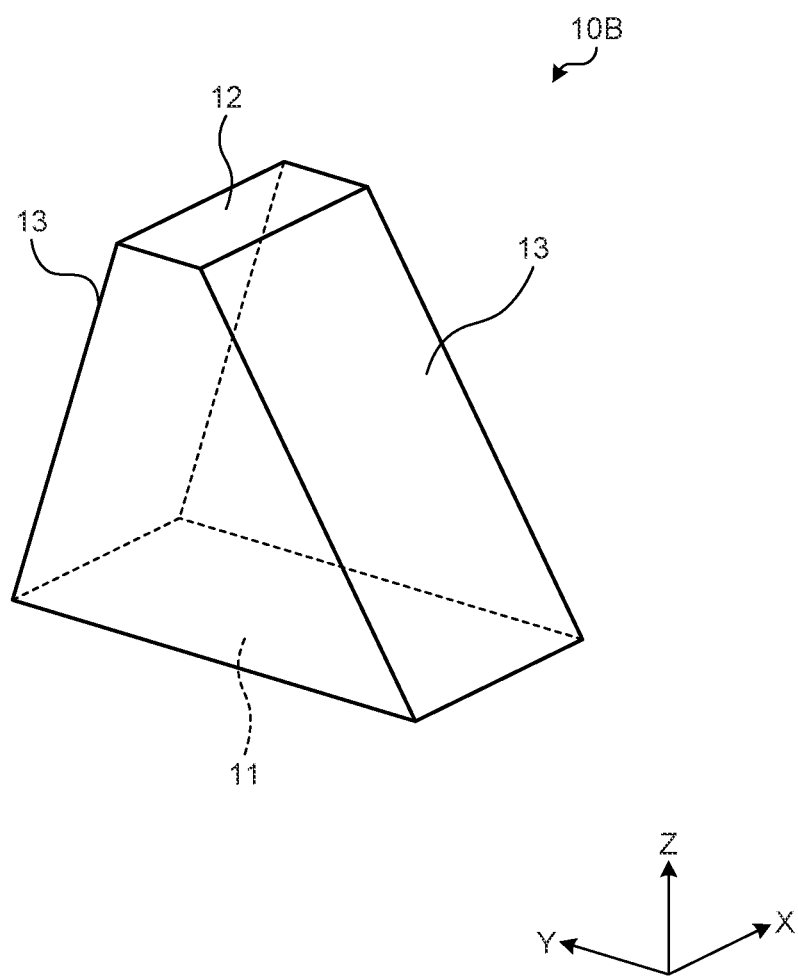
FIG. 12 is a perspective view schematically illustrating a thermoelectric conversion element according to a second embodiment.
Figure 13:
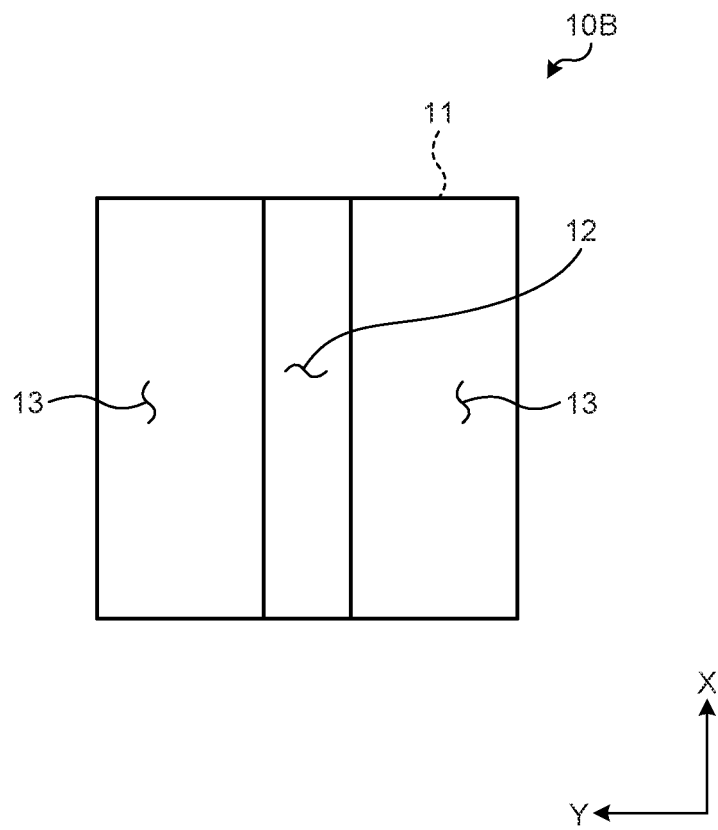
FIG. 13 is a plan view schematically illustrating the thermoelectric conversion element according to the second embodiment.

FIG. 12 is a perspective view schematically illustrating a thermoelectric conversion element 10B according to the present embodiment. FIG. 13 is a plan view schematically illustrating the thermoelectric conversion element 10B according to the present embodiment. As illustrated in FIGS. 12 and 13, the first end surface 11 may have a rectangular shape longer in Y-axis direction, and the second end surface 12 may have a rectangular shape longer in X-axis direction. The side surface 13, which connects a side on +Y side of the first end surface 11 and a side on +Y side of the second end surface 12, and the side surface 13, which connects a side on −Y side of the first end surface 11 and a side on −Y side of the second end surface 12 may be respectively inclined with respect to the first end surface 11, and the side surface 13, which connects a side on +X side of the first end surface 11 and a side on +X side of the second end surface 12, and the side surface 13, which connects a side on −X side of the first end surface 11 and a side on −X side of the second end surface 12 may be respectively orthogonal to the first end surface 11.

Third Embodiment

A third embodiment will be described. In the following description, the same or equivalent components as those in the above-described embodiment are designated by the same reference numerals, and the description thereof will be simplified or omitted.

Figure 14:
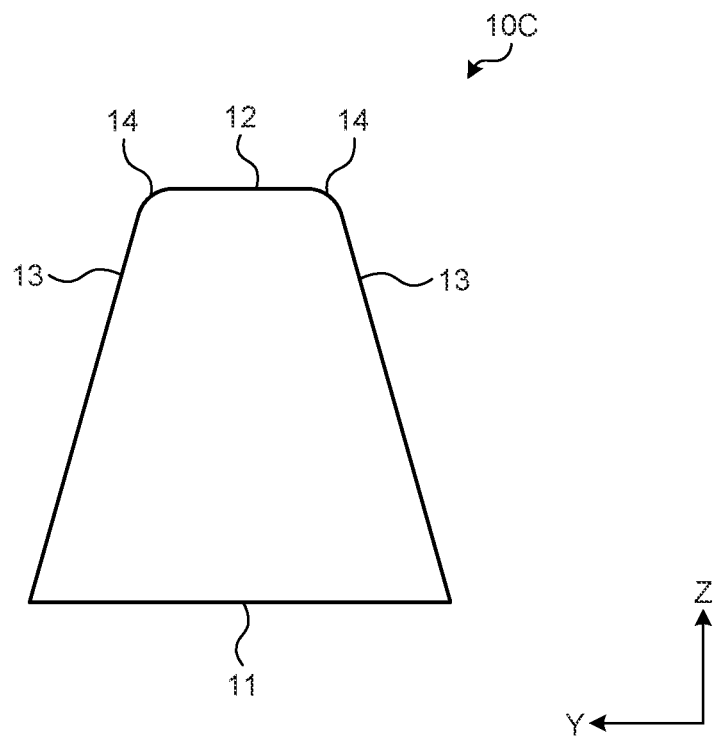
FIG. 14 is a cross-sectional view schematically illustrating a thermoelectric conversion element according to a third embodiment.

FIG. 14 is a cross-sectional view schematically illustrating a thermoelectric conversion element 10C according to the present embodiment. As illustrated in FIG. 14, the second end surface 12 and the side surface 13 may be connected by curved lines 14 in cross section of the thermoelectric conversion element 10C parallel to YZ plane. That is, corner portions between the second end surface 12 and the side surface 13 may be rounded and chamfered (R-chamfered).

Fourth Embodiment

A fourth embodiment will be described. In the following description, the same or equivalent components as those in the above-described embodiment are designated by the same reference numerals, and the description thereof will be simplified or omitted.

Figure 15:
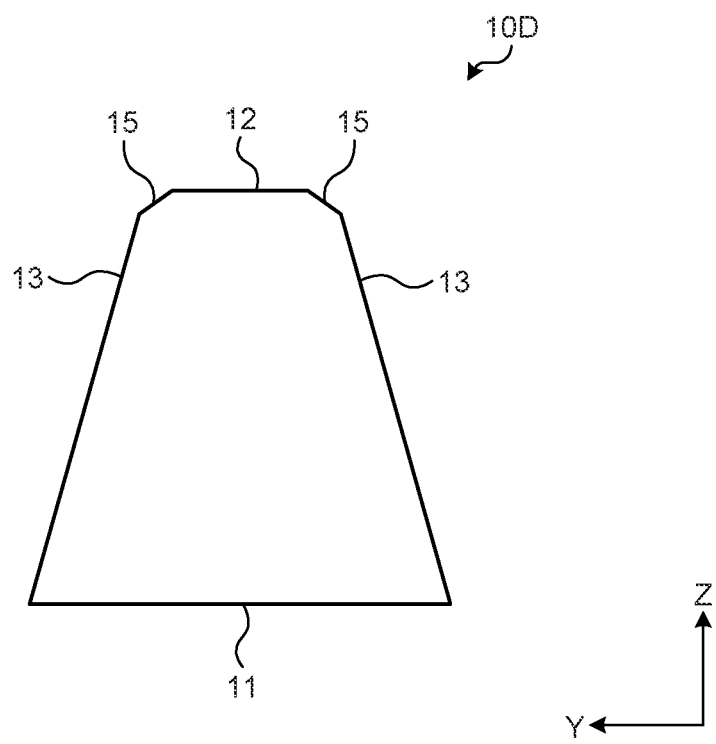
FIG. 15 is a cross-sectional view schematically illustrating a thermoelectric conversion element according to a fourth embodiment.

FIG. 15 is a cross-sectional view schematically illustrating a thermoelectric conversion element 10D according to the present embodiment. As illustrated in FIG. 15, the second end surface 12 and the side surface 13 may be connected by straight lines 15 in cross section of the thermoelectric conversion element 10D parallel to YZ plane. That is, the corner portions between the second end surface 12 and the side surface 13 may be square chamfered (C-chamfered).

Other Embodiments

In the above-described embodiments, the thermoelectric conversion elements 10 (10B, 10C, and 10D) each has a tapered shape in which the cross-sectional area S gradually decreases from the first end surface 11 to the second end surface 12. In the thermoelectric conversion element 10, the outer shape and size of the first end surface 11 and the outer shape and size of the second end surface 12 may be equal to each other. That is, the thermoelectric conversion element 10 may not necessarily have a tapered shape.

In the above-described embodiments, the outer shape in cross section of the thermoelectric conversion elements 10 (10B, 10C, and 10D) parallel to the surface of the substrate W is a quadrangle (square or rectangular). The outer shape in cross section of the thermoelectric conversion element 10 can be set optionally. The outer shape of the cross section of the thermoelectric conversion element 10 may be, for example, a rhombus or a parallelogram. Further, the outer shape of the cross section of the thermoelectric conversion element 10 is not limited to a quadrangle. The outer shape of the cross section of the thermoelectric conversion element 10 may be, for example, a pentagon, a hexagon, an octagon, a circle, or an ellipse. It is to be noted that by configuring the outer shape with a quadrangle of the cross section of the thermoelectric conversion element 10, the occupancy rate of the thermoelectric conversion element 10 on the surface of the substrate W can be kept high. This is an advantageous point.

The invention claimed is:

1. A thermoelectric conversion element comprising:
a first end surface;
a second end surface; and
a side surface connecting a peripheral edge portion of the first end surface and a peripheral edge portion of the second end surface,
wherein the thermoelectric conversion element is configured to, based on a temperature difference between the first end surface and the second end surface, generate a potential difference between the first end surface and the second end surface,
wherein a shape of the thermoelectric conversion element satisfies conditions including 100 [µm$^2$]≤S and 5 [µm] ≤L≤100 [µm], where S denotes an area of a first cross section parallel to the first end surface, and L denotes a height that indicates a distance between the first end surface and the second end surface in a direction orthogonal to the first end surface, and
wherein the shape of the thermoelectric conversion element further satisfies a range defined in a coordinate system (S [µm$^2$], y[1/cm]), where y denotes a shape factor corresponding to a ratio of the height L with respect to the area S, wherein the range is surrounded by line equations that are defined in the coordinate system (S [µm$^2$], y [1/cm]) and include:
La represented by y=50000/S,
Lb represented by y=1000000/S,
Lc represented by S=100 [µm$^2$], and
Ld represented by y=0.1 [1/cm].

2. The thermoelectric conversion element according to claim 1, wherein an outer shape of the second end surface is smaller than an outer shape of the first end surface,
wherein the side surface is inclined with respect to the first end surface, in a second cross section orthogonal to the first end surface, and
wherein a condition of 25[°]≤θ1<90[°] is satisfied, where θ1 represents an internal angle formed by the first end surface and the side surface.

3. The thermoelectric conversion element according to claim 1, wherein the second end surface and the side surface are connected by a curved line, in a second cross section orthogonal to the first end surface.

4. The thermoelectric conversion element according to claim 1, wherein the second end surface and the side surface are connected by a straight line, in a second cross section orthogonal to the first end surface.

5. The thermoelectric conversion element according to claim 1, wherein the side surface is one of a plurality of side surfaces that connect peripheral edges of the first end surface to peripheral edges of the second end surface,
wherein each of the plurality of side surfaces is inclined with respect to the first end surface and defines an internal angle θ1 with respect to the first end surface, the internal angle θ1 being less than 90 degrees, and
wherein the internal angle θ1 defined between one of the plurality of side surfaces and the first end surface is equal to the internal angle θ1 defined between another of the plurality of side surfaces and the first end surface.

* * * * *